United States Patent [19]
Vodinh

[11] 3,937,877
[45] Feb. 10, 1976

[54] POSITION INDICATING DEVICE

[75] Inventor: Hien Vodinh, Fort Wayne, Ind.

[73] Assignee: The Magnavox Company, Fort Wayne, Ind.

[22] Filed: Apr. 17, 1974

[21] Appl. No.: 461,665

Related U.S. Application Data

[63] Continuation-in-part of Ser. No. 456,401, March 27, 1974, abandoned.

[52] U.S. Cl................. 178/7.3 R; 325/455; 334/87
[51] Int. Cl.².......................................... H04N 3/16
[58] Field of Search............ 334/1, 2, 7, 49, 86, 87; 178/7.3 R, 7.3 D, DIG. 15; 325/452, 455, 458–459, 464–465, 463; 340/147 C; 116/124.1–124.4; 353/41; 200/38 BA, 38 CA:38 C, 153 L, 27 B, 35 R

[56] References Cited
UNITED STATES PATENTS

| | | | |
|---|---|---|---|
| 3,204,051 | 3/1965 | Blodgett | 200/38 BA |
| 3,632,912 | 1/1972 | Schuenke | 200/38 CA |
| 3,671,869 | 6/1972 | Wolfram | 334/86 X |

Primary Examiner—Benedict V. Safourek
Assistant Examiner—Robert Hearn
Attorney, Agent, or Firm—Thomas A. Briody; William J. Streeter; Joe E. Barbee

[57] ABSTRACT

A TV channel indicator wherein the tuner shaft carries a program disc having a plurality of cam sticks, each of which has a cam surface corresponding to a respective channel. There is a panel of leaf switches which play against the cam surfaces to close the switches in a manner dictated by the cam surface configuration, thereby selectively energizing the segments of a seven-segment numerical display to provide illuminated channel numbers corresponding to the tuner shaft position. Tuning of the tuner shaft brings the cam surfaces into registration with the switch ends.

5 Claims, 5 Drawing Figures

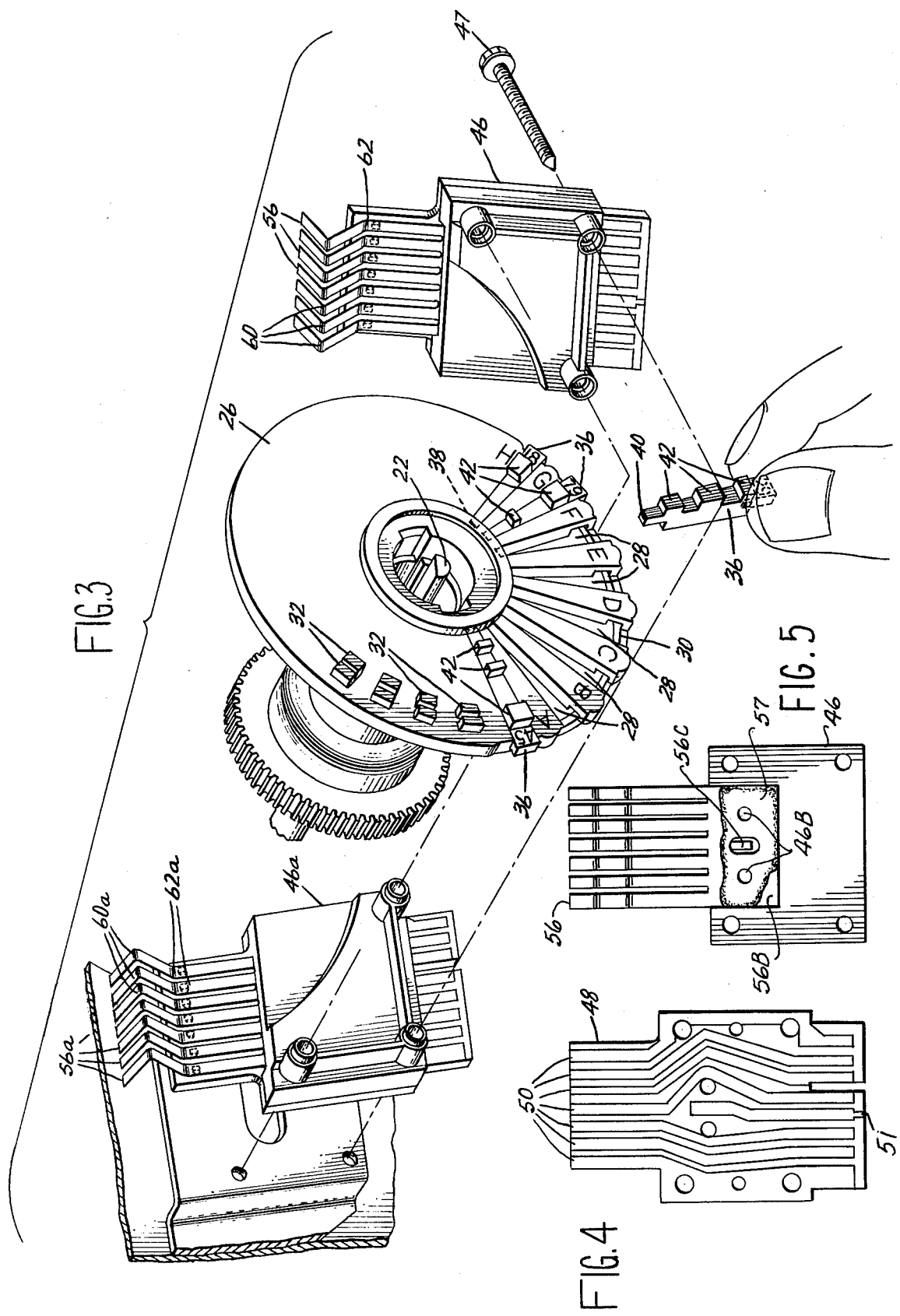

POSITION INDICATING DEVICE

RELATED APPLICATIONS

This is a continuation in part of copending application, Ser. No. 456,401, filed [3-27-74] Mar. 27, 1974, now abandoned, and entitled, "Position Indicating Device," by Hien Vodinh, common assignee.

BACKGROUND OF THE INVENTION

Efforts have been made previously in the TV receiver art to display the numerals of the TV channel to which the receiver is tuned in a location and of a size and brightness where a viewer can readily ascertain such numerals from a viewing distance regardless of room light. These efforts have included placing a disc on the tuner shaft which has stenciled in the outer circumference thereof channel numerals which pass in front of a light source, and these numerals are so positioned on the disc so that the numeral illuminated corresponds to the channel to which the receiver is tuned. Certain of the prior art devices also had replaceable numerals on the disc which allowed for interchangeability required by the fact that different areas had differently numbered channels. These systems had the obvious limitation that the numerals, of necessity, had to be located at the tuner shaft and more importantly, were limited in size to fit on a disc carried by the tuner shaft.

The present invention overcomes the above difficulties by providing in a relatively low-cost device a numerical display of the selected channel numbers which can be placed at any convenient location on the TV receiver control panel and be of any desired size so that it may be easily read from normal TV viewing distances.

SUMMARY OF INVENTION

A television receiver tuner position indicator having a circular program disc, which carries replaceable program cam sticks, connected to and rotatable with the tuner shaft. Each cam stick represents a channel and has a surface configuration which identifies with a particular channel. A switch panel from which a plurality of leaf switches are cantilevered, is connected to the television receiver chassis in such a manner that the free end of the leaf switches play on the cam surfaces. Each switch, when moved outwardly by a cam surface portion, closes a contact in the switch panel which energizes one segment of a 7-segment numerical digital display. The cam stick for a given channel has raised portions which come into registration with the leaf switches as the tuner shaft is turned, thereby moving an appropriate leaf switch, or leaf switches, outwardly, closing the respective contacts and illuminating their respective segments in the digital display thereby signifying the channel number. In the disclosed embodiment, a two-digit channel display is obtained by providing each side of a cam stick with cam surfaces, one side for one digit and the opposite side for the other digit, and having a switch panel registrable with each cam side.

The cam sticks may represent VHF, UHF, or cable stations. There may also be a segment of the program disk which has the cam portions molded permanently thereon to represent the VHF stations.

BRIEF DESCRIPTION OF DRAWINGS

FIG. 3 is an exploded view of the major elements of the embodiment of FIG. 1; and FIG. 4 is a plan view of the insulative board in each switch panel.

FIG. 5 is a plan view, partially broken away, of the leaf switch base.

Figure 1:
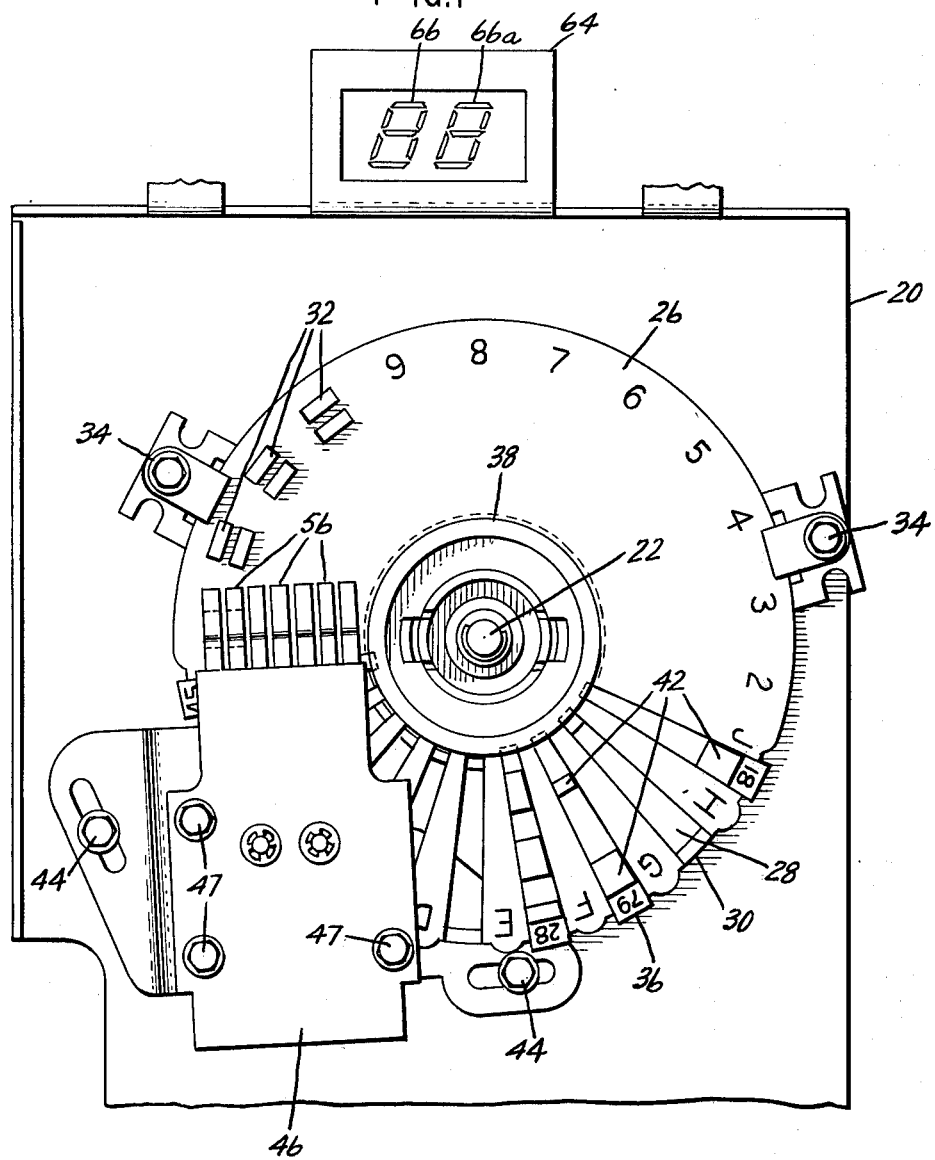
FIG. 1 is a plan view of a preferred embodiment of this invention.
Figure 2:
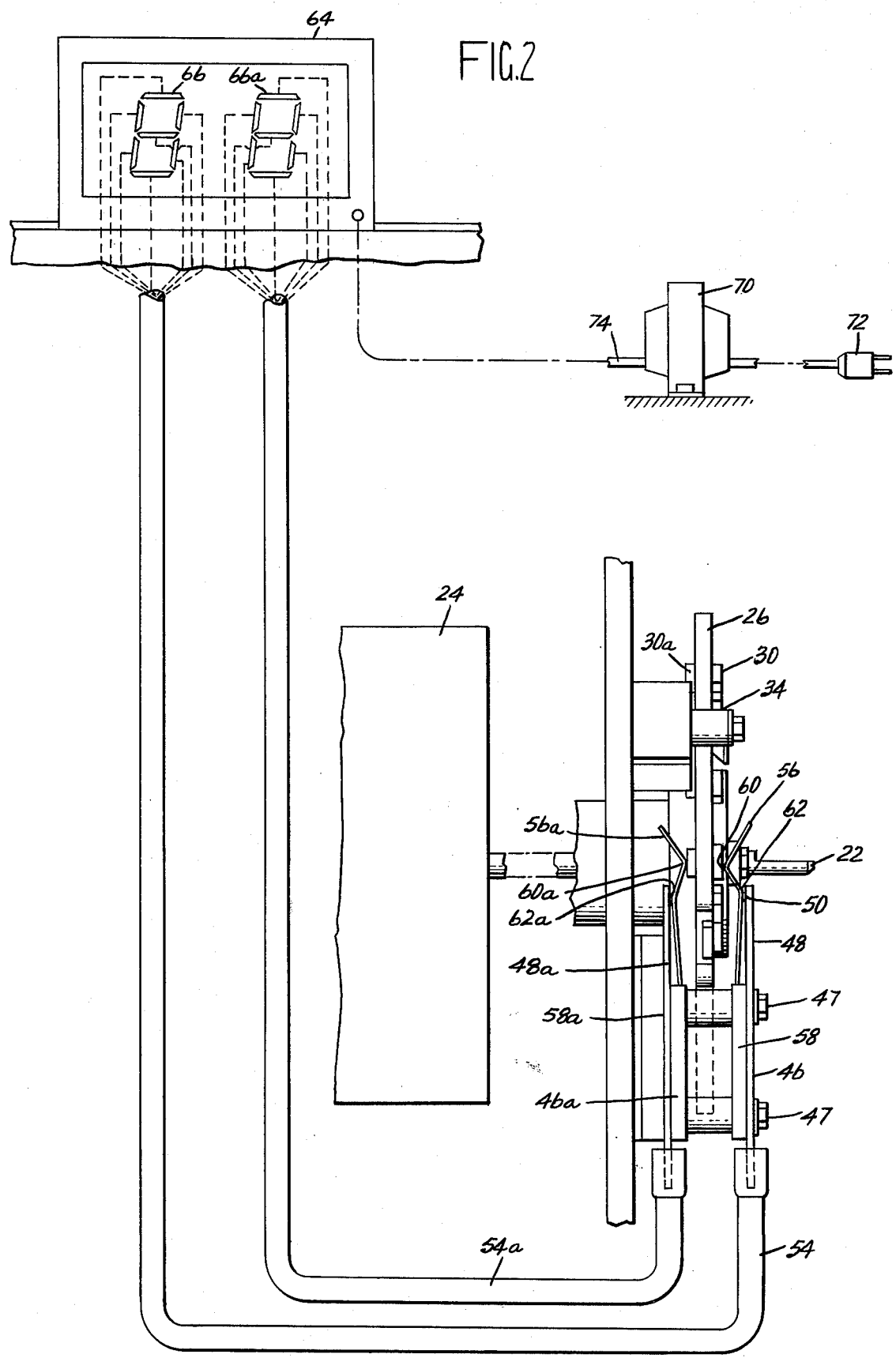
FIG. 2 is a partial, diagrammatic, in part elevational, view of the embodiment of FIG. 1.

In the figures, there is shown a chassis mounting board 20 which is fixed to the television chassis, and which rotatably carries a tuner shaft 22 connected to a tuner mechanism 24 and shown diagrammatically, of conventional design. Shaft 22 has fixed thereto and carries therewith a program disc 26 which has a plurality of radial slots 28, each of which have a peripheral rail 30 at the outer extremity thereof. In a preferred configuration, there are nine open slots, each corresponding to a UHF station, as later described.

Program disc 26 also has a plurality of moulded cam surfaces 32 formed thereon with each series of cam surfaces corresponding to a VHF station. Disc guides 34 are attached to the mounting board 20 and slidably engage the program disc 26 at its periphery to maintain it in alignment.

Each of the open slots 28 is adapted to receive a program cam stick 36, each of which corresponds to a selected UHF station and, as mentioned, in the illustrated preferred embodiment, there are nine slots and sticks but this number, of course, may be varied. Near the center of the program disc 26 is a circular groove 38 into which the ends 40 of each program stick may be inserted afterwhich the program stick is snapped over the peripheral ring 30 to secure it in place in its respective slot. Each program stick 36 has a cam surface or combination of cam surfaces 42 which will operate to illuminate the channel number to which the receiver is tuned as will be later described.

Also attached to mounting board 20 by means of mounting screws 44 are switch panels 46 and 46a mounted on either side of program disc 26 and fastened together by bolts 47. Panels 46, 46a are of similar construction and corresponding parts will have the same numeral designation with those in panel 46a carrying the letter suffix a. Panel 46 comprises an insulated board 48, FIG. 4, which has thereon seven conductive terminals 50, each of which is electrically connected to a separate wire in a seven-wire cable 54 with conductive terminal 51 being grounded. Seven leaf switches 56 are cantilevered from a common conductive base, 56b, (FIG. 5), which has finger 56c struck therefrom, in insulative block 58 which is a portion of panel 46. Insulative insert 57 has a cut out 57a which exposes finger 56c so that it can make contact with ground terminal 51 when assembled in panel 46. Insert 57 is heat staked at 46b to the panel 46 cover. Each leaf switch 56 has a cam contacting portion 60 and a terminal contacting portion 62 and are so configured that when the cam contacting portion 60 is raised by a cam on program disc 26, the contact between terminal 50 and switch portion 62 is closed. Each leaf switch 56 is made of a conductive material and is electrically grounded to terminal 51 so that when a leaf switch 56 contacts a terminal 50, an electrical circuit to ground is made. These switches 56 are made of a metallic springlike material; and in their normal positions, they extend away from terminals 50 so that the circuit is open, and it is only when they are lifted by a cam surface 42 that they contact terminals 50.

Each seven-wire cable 54 and 54a leads to a digital box 64 which has two seven-segment digits 66 and 66a with each of the segments being individually energized by separate wires in the seven-wire cable. These seven-segment digital numerals are well known to the art, and a preferred embodiment is shown in U.S. Pat. No. 3,758,973 to Gary L. Miller entitled, "One-Piece Character Display Device," issued Sept. 18, 1973, common assignee, and is incorporated by reference herein. Further, the structure shown in copending application 461,666, common assignee, filed Apr. 17, 1974, entitled, "Multi-Level Television Receiver Channel Indicia Display," inventors: Arthur N. Borg and Bruce E. Smith, showing in more detail the structure of digital box 64, in addition to multi-level brightness circuitry is incorporated by reference herein. Terminal 48 in the Borg et al. application may be connected to line 74 and switches 50b–56b therein correspond to switches 56 herein, and switches 60b–66b therein correspond to switches 56a herein, and ground strip 51 herein may be connected to the diode D-1 cathode therein.

In brief, each segment of a seven-segment display can be energized independently and with the proper segments illuminated, any numeral can be displayed from the seven segments; therefore, the cam surfaces 42 on each cam stick 40 can be placed to close the leaf switches which will illuminate the desired numeral segments of the seven-segment display 66, thereby illuminating a numeral corresponding to the received channel. Leaf switches 56 are aligned with cam projections on one side of program disc 26 and are connected by means of cable 54 to seven-segment display 66, while leaf switches 56a are aligned with cam projections on the opposite side of program disc 26 and are connected by means of cable 54a to seven-segment display 66a, thereby providing two-digit capacity for this embodiment of the invention.

A transformer 70 which has a plug 72 for connection to an external power source, not shown, is used to supply through cable 74 power to illuminate the segments in digital box 64. When a leaf switch 56 contacts its corresponding terminal 50, a circuit is completed from the power source to ground terminal 51 through contact 56c, FIG. 5, to illuminate the corresponding segment in lamps 66, 66a.

Program disc 26 may be supplied entirely with slots 28 and removeable cam sticks 36 for insertion in these slots, or it can be provided partially with the slots 28 and cam sticks 36 and have permanent moulded cam portions in the remainder of the program disc sector, or all the cam portions may be molded on disc 26. In the illustrated preferred embodiment, program sticks are utilized to designate UHF and/or cable channels while permanently-moulded cam surfaces are used for VHF channels.

OPERATION OF A PREFERRED EMBODIMENT

In operation of the embodiment shown in the drawings, the viewer turns the tuner shaft 22 by means of a viewer actuable knob, not shown, which is attached to shaft 22, to select a preferred channel. Turning of shaft 22 accomplishes two functions; first, the TV receiver tuner mechanism shown schematically at 24 is actuated to tune the receiver to receive the indicated channel and second, program disc 26 is turned causing the correct channel indication to be displayed in digital box 64 which may be located in any convenient spot on the receiver and may be of any convenient size. As program disc 26 turns, different combinations of cam elevations are brought into contact with leaf switches 56, 56a, and each combination of cam surfaces is selected to illuminate those segments in digital box 64 which will display the channel number corresponding to that which the receiver is tuned at that position of the disc 26. For each of the numerals 0 through 9, a different combination of cam elevations will exist, thereby raising a different combination of leaf switches 56 to close contact with corresponding terminals 50 and energize the corresponding segments of the seven-segment display 66 by completing the circuit for those segments through line 74, transformer 70, and the power source. For example, if it is desired to display the numeral 8, then all leaf switches will be raised closing all contacts 50 illuminating all seven segments. If the numeral 9 is desired to be displayed, then all segments but the lower left segment will be illuminated and so forth to display all the numerals.

The above described embodiment is utilized in The Magnavox Company chassis No. T-989.

Other embodiments than that shown herein will occur to one skilled in the art and the scope of this invention is defined in the following claims.

I claim:

1. Television receiver channel numeral indicating apparatus comprising,
    tuner means for receiving a television signal and having a tuner shaft rotatable to any of a plurality of positions, each position corresponding to a respective television transmitted channel,
    disc means attached to said tuner shaft and rotatable therewith,
    a plurality of slot means being placed in said disc means,
    a plurality of cam sticks, each stick having a cam surface, said cam sticks insertable into and removable from a respective slot means,
    a leaf switch panel fixedly mounted to the television receiver chassis and carrying in a cantilever manner a plurality of leaf switches,
    said panel being positioned so that the free end of said leaf switches are in registration with the cam surfaces of said cam stick, as said tuner shaft is rotated,
    multi-segment display means having a plurality of individual segments being located on said television receiver at a readily viewable position,
    means for illuminating each of said segments,
    each of said leaf switches being in operable relation to said means for illuminating a segment of said display means,
    said cam surfaces being configured to operate those switches which will illuminate the segments to numerically identify on said display means the tuner channel selected.

2. The apparatus of claim 1 with each of said cam sticks having a second cam surface on a side opposite to said cam surface, said cam surface corresponding to a ones-digit of channel numeral display and said second cam surface corresponding to a tens-digit of the channel numeral display,
    a second leaf panel switch fixedly mounted to the television receiver chassis and carrying in a cantilever manner a second plurality of leaf switches with the free ends of said second plurality of leaf switches being in registration with said second cam surface, as said tuner shaft is rotated.

3. Television receiver means comprising, a television receiver having a picture tube mounted on a chassis, tuner means for tuning the television receiver to a desired transmitted television signal channel, upon rotation of a tuner shaft, disc means attached to said tuner shaft and rotatable therewith, said disc means having radially aligned cam combinations, each radial cam combination corresponding to VHF channels, said disc means having a plurality of radial slots, each slot corresponding to a UHF channel, a plurality of UHF cam sticks which are snappable into said slots, each of said cam sticks having a cam surface on either side thereof with one side corresponding to the tens digit and the other side corresponding to the ones digit, a first leaf switch panel having seven leaf switches cantilevered therefrom and mounted on the TV chassis so that the free end of the switches play on the cam surfaces on the ones-digit side of said disc as the tuner shaft is rotated, a second leaf switch panel having seven-leaf switches cantilevered therefrom and mounted on the TV chassis so that the free end of the switches play on the cam surfaces on the tens digit side of said disc as the tuner shaft is rotated, a first seven-segment ones digit number display mounted on said television receiver in a readily viewable area and of a readily read size, a second seven-segment tens digit number display mounted on said television receiver in a leftwardly location to said first display, means including activating means for individually illuminating each of the segments in each of the displays, each of said leaf switches in each of said panels being in operable relation to an actuating means to operate said actuating means and thereby illuminating a segment, said cam surfaces being configured to move said leaf switches and operate the respective actuating means to illuminate the segments and numerically identify on said first and second displays the tuner channel selected.

4. Television channel numeral indicating apparatus comprising, tuner means for receiving a television signal and having a tuner shaft rotatable to any of a plurality of positions, each position corresponding to a respective television channel, disc means attached to said tuner shaft and rotatable therewith, a plurality of slot means in said disc means, a plurality of cam sticks, each stick having a cam surface, insertable and removable from a respective slot means, switch means mounted in operative relationship to said disc means and the cam surfaces of said cam sticks for selective actuation thereby, illuminable display means located on said television receiver at a readily viewable position and electrically connected to said switch means, said cam surfaces being configured to operate said switch means to selectively illuminate said display means to numerically display the tuner channel selected.

5. Television channel numeral indicating apparatus comprising, tuner means for receiving a television signal and having a tuner shaft rotatable to any of a plurality of positions, each position corresponding to a respective television channel, disc means attached to said tuner shaft and rotatable therewith, a plurality of slot means in said disc means, a plurality of cam sticks, each stick having a first cam surface and a second cam surface, insertable and removable from a respective slot means, switch means mounted in operative relationship to said disc means and the cam surfaces of said cam sticks for selective actuation thereby, illuminable display means located on said television receiver at a readily viewable position and electrically connected to said switch means, said cam surfaces being configured to operate said switch means to selectively illuminate said display means to numerically display the tuner channel selected.

* * * * *

UNITED STATES PATENT OFFICE
CERTIFICATE OF CORRECTION

Patent No. 3,937,877            Dated February 10, 1976

Inventor(s) Hien Vodinh

It is certified that error appears in the above-identified patent and that said Letters Patent are hereby corrected as shown below:

On the cover sheet, item [22] should read --Filed: Apr. 23, 1974--.

Signed and Sealed this first Day of June 1976

[SEAL]

Attest:

RUTH C. MASON
Attesting Officer

C. MARSHALL DANN
Commissioner of Patents and Trademarks